: US 7,239,572 B2
(45) Date of Patent: Jul. 3, 2007

(54) MULTIPORT MEMORY

(75) Inventor: Yuichiro Ikeda, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 15 days.

(21) Appl. No.: 11/184,926

(22) Filed: Jul. 20, 2005

(65) Prior Publication Data

US 2006/0023557 A1 Feb. 2, 2006

(30) Foreign Application Priority Data

Jul. 27, 2004 (JP) ............................ P2004-218301

(51) Int. Cl.
*G11C 8/00* (2006.01)
(52) U.S. Cl. ...................... 365/230.05; 365/189.01; 365/194
(58) Field of Classification Search .......... 365/230.05, 365/194, 189.01
See application file for complete search history.

(56) References Cited

U.S. PATENT DOCUMENTS 6,400,597 B1 * 6/2002 Nagaoka ...................... 365/63
6,538,933 B2 * 3/2003 Akioka et al. ............... 365/194

OTHER PUBLICATIONS

Klein, et al., "350 MHz Time-Multiplexed 8-port SRAM and Word-Size Variable Multiplier for Media Processor", The Institute of Electronics, Information and Communication Engineers, pp. 57-64, Mountain View, CA, (w/English Translation, pp. 1-4).

* cited by examiner

*Primary Examiner*—David Lam
(74) *Attorney, Agent, or Firm*—McDermott Will & Emery LLP

(57) ABSTRACT

This multiport memory has a memory hold circuit, a plurality of write circuits and read circuits, and a read/write capability regulating circuit. The read/write capability regulating circuit individually sets a write/read capability of each of the write/read circuits. The read/write capability regulating circuit determines, using an operating state determining circuit, the number of writing/reading times per unit time in accordance with an operating state of each of the read/write circuits. As the operating state determining circuit used is a noise amount detection circuit, an operation completion detecting circuit, or a potential fluctuation detecting circuit.

24 Claims, 14 Drawing Sheets

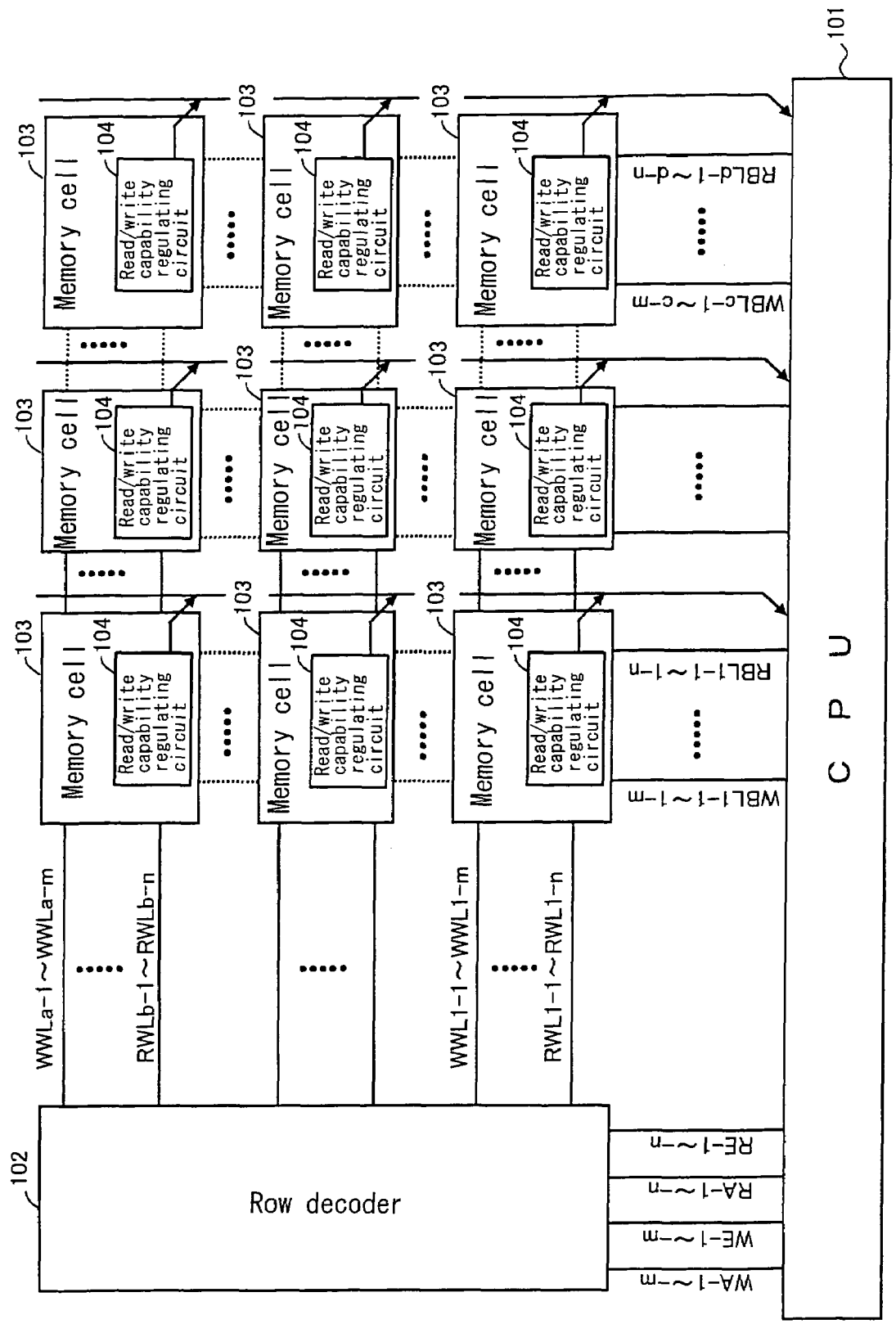

F I G. 2
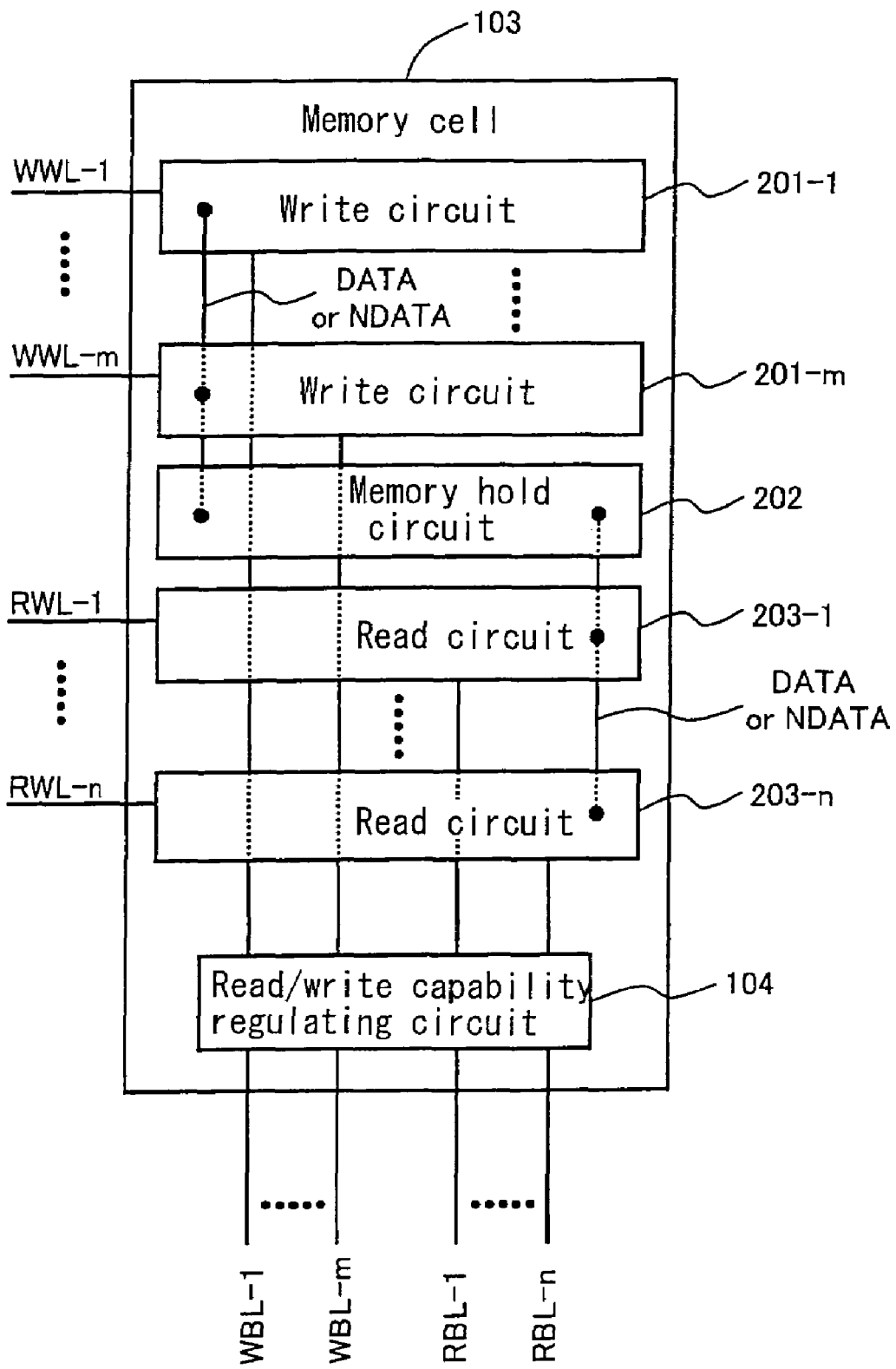

F I G. 9
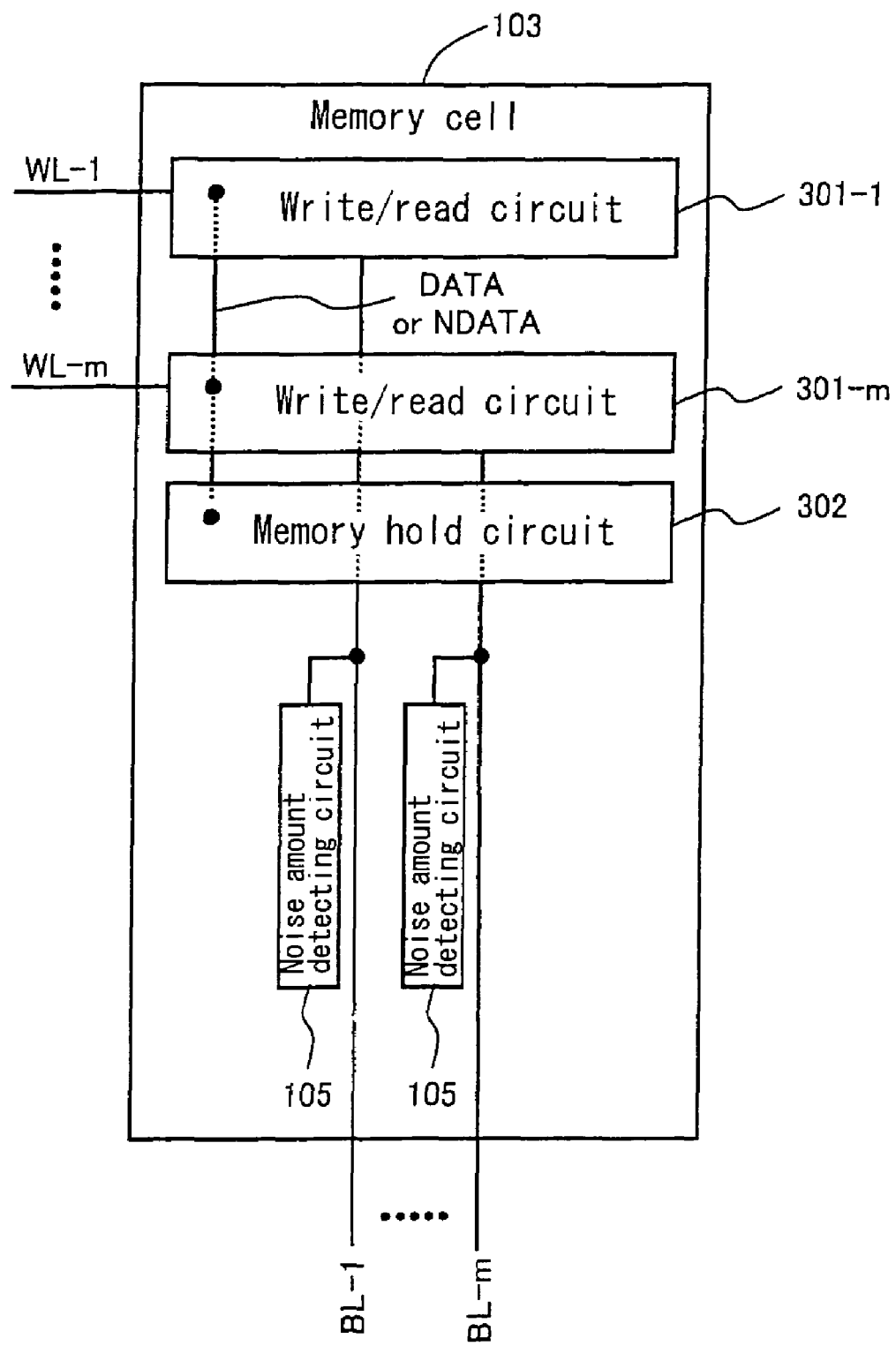

F I G. 1 5
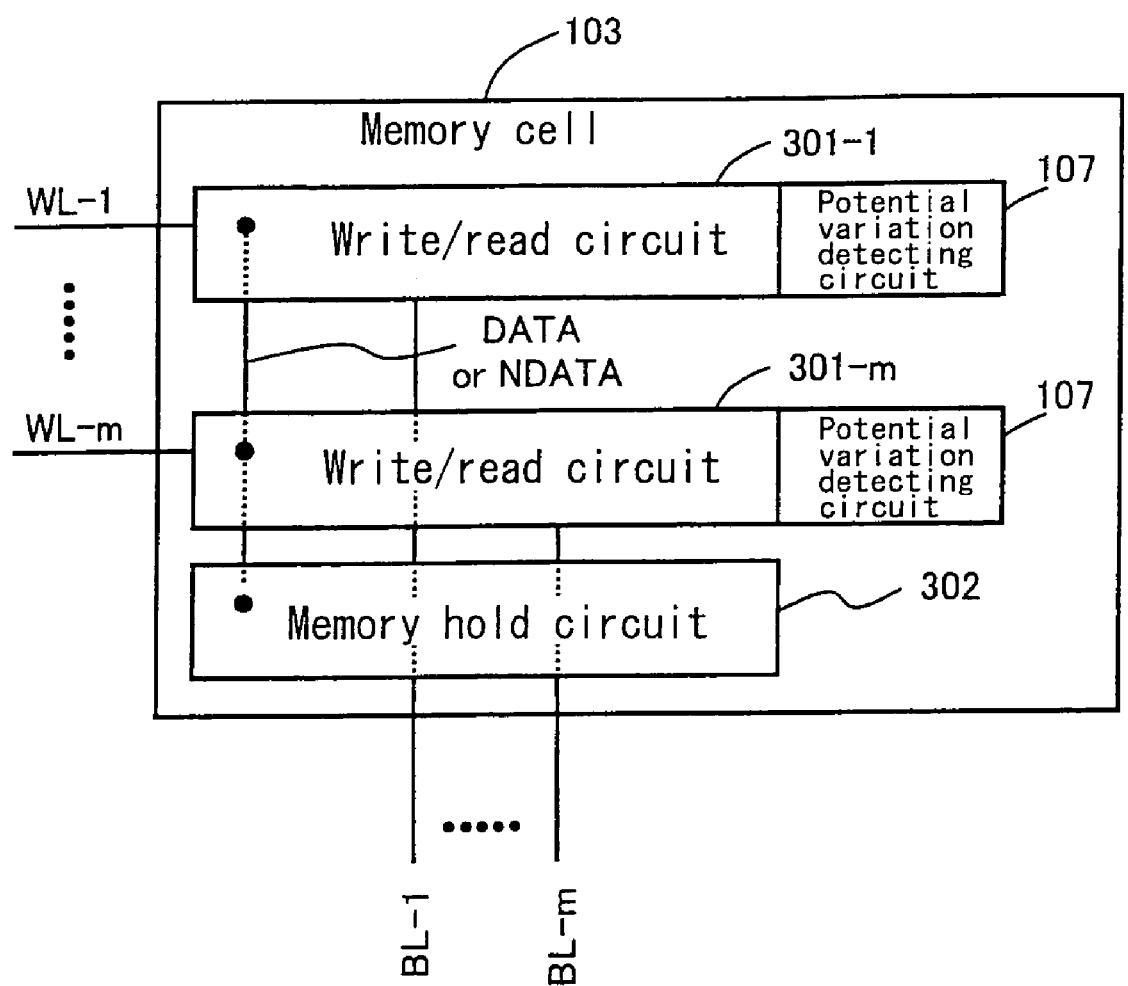

MULTIPORT MEMORY

BACKGROUND OF THE INVENTION

1. Field of the Related Art

The present invention relates to a multiport memory having a memory hold circuit and a plurality of write circuits, or a multiport memory having a memory hold circuit and a plurality of read circuits, on a semiconductor substrate. The present invention is especially preferable for the case where the memory hold circuit is a register file, an SRAM (Static random Access Memory), or the like.

2. Description of the Related Art

As a conventional multiport memory, there is known a memory which performs writing or reading not just once but a plurality of times per unit time so as to obtain a capability greater than a write/read capability per unit time which is determined with a bit width of each circuit. An example of such multiport memories is disclosed in "Media processor-oriented multiplex eight-port SRAM to operate at 350 MHz and a word length variable multiplier; Ichida, Sakurai et al., Shingaku Giho 96.04 (pages 59-60, FIG. 6)".

In the above-mentioned conventional technique, the number of writing times and the number of reading times per unit time are common in all write circuits. Further, the number of writing times and the number of reading times per cycle are also common in all cycles.

However, in the case of providing a plurality of write circuits, write circuits required to have different write capabilities may be mixed as provided. When these write circuits are in common use and the number of writing times per cycle of all the write circuits is to be made common and fixed, the number of writing times per cycle is matched to the number of writing times per cycle of a circuit required to have the highest access capability. This is called rate controlling. The rate controlling necessitates an extra operation of each of the circuits. Consequently, as for a circuit having a low access capability, the circuit scale increases in an undesirable manner, and further the power consumption also increases.

Similarly, in the case of providing a plurality of read circuits, read circuits required to have different read capabilities may be mixed as provided. When these read circuits are in common use and the number of reading times per cycle of all the read circuits is to be made common and fixed, the number of reading times per cycle is matched to the number of reading times per cycle of a circuit required to have the highest access capability. This is also called rate controlling. The rate controlling necessitates an extra operation of each of the circuits. Consequently, as for a circuit having a low access capability, the circuit scale increases in an undesirable manner, and further the power consumption also increases.

SUMMARY OF THE INVENTION

Accordingly, a primary object of the present invention is to allow a multiport memory, having a plurality of write circuits and a memory hold circuit into which data is written by means of the plurality of write circuits, to obtain a prescribed performance with a minimum configuration.

For solving the foregoing problem, as a basic idea of the present invention, the number of writing times of each of the write circuits is regulated with respect to each circuit or each cycle in order to obtain a prescribed performance with a minimum configuration. Further, the number of reading times of each of the read circuits is regulated with respect to each circuit or each cycle in order to obtain a prescribed performance with a minimum configuration.

Specifically, a multiport memory according to the present invention comprises: a plurality of write circuits; a memory hold circuit into which data is written by means of the write circuits; and a write capability regulator for individually setting a capability to write data into the memory hold circuit by means of each of the write circuits.

With this configuration, the write capability regulator individually sets a required write capability for each of the circuits. This can eliminate the need for the extra write operation, and further suppresses the increase in circuit scale.

Further, a multiport memory according to the present invention comprises: a plurality of read circuits; a memory hold circuit from which data is read by means of the read circuits; and a read capability regulator for individually setting a capability to read data from the memory hold circuit by means of each of the read circuits.

With this configuration, the read capability regulator individually sets a required read capability for each of the circuits. This can eliminate the need for the extra read operation, and further suppresses the increase in circuit scale.

There are favorable modes of the write capability regulator and the read capability regulator, as described below.

It is preferable that the write capability regulator individually set the number of writing times per the unit time of each of the write circuits.

With this configuration, it is possible to individually regulate the number of writing times to a suitable one for each of the write circuits. Namely, it is possible to eliminate an unnecessary write operation which occurs due to commonality of the number of writing times among all the write circuits.

It is also preferable that the read capability regulator individually set the number of reading times per the unit time of each of the read circuits.

With this configuration, it is possible to individually regulate the number of reading times to a suitable one for each of the read circuits. Namely, it is possible to eliminate an unnecessary read operation which occurs due to commonality of the number of reading times among all the read circuits.

Further, it is possible that the write capability regulator have an operating state determining circuit, and the operating state determining circuit determine the number of writing times per the unit time of each of the write circuits in accordance with an operating state of each of the write circuits.

With this configuration, the operating state determining circuit determines the number of writing times in accordance with an operating state of each of the write circuits, thereby enabling autonomous setting of the optimum number of writing times for each of the circuits. Consequently, it is possible to obtain an optimum writing capability in accordance with the circuit operation.

It is also possible that the read capability regulator have an operating state determining circuit, and the operating state determining circuit determine the number of reading times per the unit time of each of the read circuits in accordance with an operating state of each of the read circuits.

With this configuration, the operating state determining circuit determines the number of reading times in accor dance with an operating state of each of the read circuits, thereby enabling autonomous setting of the optimum number of reading times for each of the circuits. Consequently, it is possible to obtain an optimum reading capability in accordance with the circuit operation.

There are favorable modes of the operating state determining circuit having the above-mentioned configuration, as described below.

It is preferable that the operating state determining circuit have a noise amount detecting circuit, and the noise amount detecting circuit determine the number of writing times per the unit time of each of the write circuits based upon detection of a noise amount of each of the write circuits, the noise being due to interference between wirings of the write circuits.

With this configuration, the noise amount detecting circuit detects a noise amount of each of the write circuits, the noise being due to interference between wirings of the write circuits, and determines the number of writing times per unit time based upon the detected noise amount. Therefore, even when a crosstalk between wirings due to the dense state thereof becomes a problem, it is possible to prevent the circuit from not operating through suppression of the number of writing times.

It is also preferable that the operating state determining circuit have a noise amount detecting circuit, and the noise amount detecting circuit determine the number of reading times per the unit time of each of the read circuits based upon detection of a noise amount of each of the read circuits, the noise being due to interference between wirings of the read circuits.

With this configuration, the noise amount detecting circuit detects a noise amount of each of the read circuits, the noise being due to interference between wirings of the read circuits, and determines the number of reading times per unit time based upon the detected noise amount. Therefore, even when a crosstalk between wirings due to the dense state thereof becomes a problem, it is possible to prevent the circuit from not operating through suppression of the number of reading times.

Further, it is preferable that the operating state determining circuit have an operating rate detecting circuit, and the operating rate detecting circuit determine the number of writing times per the unit time of each of the write circuits based upon detection of an operating rate of each of the write circuits.

With this configuration, since the operating state determining circuit determines the number of writing times per unit time based upon detection of an operating rate of each of the write circuits, it is possible to increase the number of writing times of a circuit which operates at a high rate, and on the other hand reduce the number of writing times of a circuit which operates at a low rate, so as to obtain an optimum reading capability.

It is also preferable that the operating state determining circuit have an operating rate detecting circuit, and the operating rate detecting circuit determine the number of reading times per the unit time of each of the read circuits based upon detection of an operating rate of each of the read circuits.

With this configuration, since the operating state determining circuit determines the number of reading times per unit time based upon detection of an operating rate of each of the read circuits, it is possible to increase the number of reading times of a circuit which operates at a high rate, and on the other hand reduce the number of reading times of a circuit which operates at a low rate, so as to obtain an optimum reading capability.

Further, it is preferable that the operating state determining circuit have a potential fluctuation detecting circuit, and the potential fluctuation detecting circuit determine the number of writing times per the unit time of each of the write circuits based upon detection of a potential of a power source/signal lines in a circuit region of each of the write circuits.

With this configuration, since the potential fluctuation detecting circuit determines the number of writing times per unit time based upon detection of a potential of a power source/signal lines in each circuit region, it is possible to decrease the number of writing times of a circuit with the potential of the power source/signal lines falling, and on the other hand increase the number of writing times of a circuit with the potential of the power source/signal lines rising, so as to suppress further falling or rising of the potential of the power source/signal lines. This can consequently prevent the circuit from not operating.

It is also preferable that the operating state determining circuit have a potential fluctuation detecting circuit, and the potential fluctuation detecting circuit determine the number of reading times per the unit time of each of the read circuits based upon detection of a potential of a power source/signal lines in a circuit region of each of the read circuits.

With this configuration, since the potential fluctuation detecting circuit determines the number of reading times per unit time based upon detection of a potential of a power source/signal lines in each circuit region, it is possible to decrease the number of reading times of a circuit with the potential of the power source/signal lines falling, and on the other hand increase the number of reading times of a circuit with the potential of the power source/signal lines rising, so as to suppress further falling or rising of the potential of the power source/signal lines. This can consequently prevent the circuit from not operating.

Further, it is preferable that the write capability regulator be configured such that the number of writing times per the unit time of each of the write circuits is settable from the outside, in accordance with a circuit specification of each of the write circuits.

With this configuration, the write capability regulator sets the number of writing times in accordance with a specification of each of the circuits, thereby enabling setting of the optimum number of writing times for the circuit specification.

It is also preferable that the read capability regulator be configured such that the number of reading times per the unit time of each of the read circuits is settable from the outside, in accordance with a circuit specification of each of the read circuits.

With this configuration, the read capability regulator sets the number of reading times in accordance with a specification of each of the circuits, thereby enabling setting of the optimum number of reading times for the circuit specification.

Further, it is preferable that the write capability regulator regulate a source potential of each of the write circuits in accordance with an active/inactive state of an operation of each of the write circuits.

It is also preferable that the read capability regulator regulate a source potential of each of the read circuits in accordance with an active/inactive state of an operation of each of the read circuits.

With this configuration, it is possible to individually set a source potential in accordance with an active/inactive state of an operation of each of the circuits, so as to seek acceleration of an operating rate or suppression of power consumption of each of the circuits.

Further, it is preferable that the write capability regulator lower a source potential of each of the write circuits when an operation of each of the write circuits is inactive.

It is also preferable that the read capability regulator lower a source potential of each of the read circuits when an operation of each of the read circuits is inactive.

With this configuration, in the case of an inactively operating circuit, it is possible to seek reduction in power consumption of each of the circuits by lowering the source potential thereof.

Further, it is preferable that the write capability regulator raise a source potential of each of the write circuits when an operation of each of the write circuits is active.

It is also preferable that the read capability regulator raise a source potential of each of the read circuits when an operation of each of the read circuits is active.

With this configuration, in the case of an actively operating circuit, it is possible to seek improvement in operating rate and stability of each of the circuits by raising the source potential thereof.

According to the present invention, as above described, it is possible to individually set an optimum writing capability for each of the write circuits, and it is also possible to individually set an optimum reading capability for each of the read circuits. This consequently leads to suppression of the extra write operation and read operation, so as to seek reduction in power consumption. It also leads to suppression of the increase in circuit scale, so as to seek for a reduced circuit area.

BRIEF DESCRIPTION OF THE DRAWINGS

Other objects of the present invention will become obvious if later-described embodiments are understood, and be specified in the claims attached to the specification. The skilled in the art would be reminded of a number of advantages of the present invention which are not described in the specification when implementing the invention.

FIG. 1 is a block diagram showing a configuration of a multiport memory in a concrete example of the basic of the present invention.

FIG. 2 is a block diagram showing a configuration of the inside of a memory cell in the multiport memory of the concrete example of the basic of the present invention.

FIG. 9 is a block diagram showing a configuration of a memory cell (with write/read circuit) in a multiport memory of Concrete Example 1 of the present invention.

FIG. 15 is a block diagram showing a configuration of a memory cell (with write/read circuit) in a multiport memory of Concrete Example 3 of the present invention.

DETAILED DESCRIPTION OF THE PREFERRED EMBODIMENTS

In the following, concrete examples of a multiport memory with respect to the present invention are specifically described based upon drawings.

CONCRETE EXAMPLE 1

Figure 3:
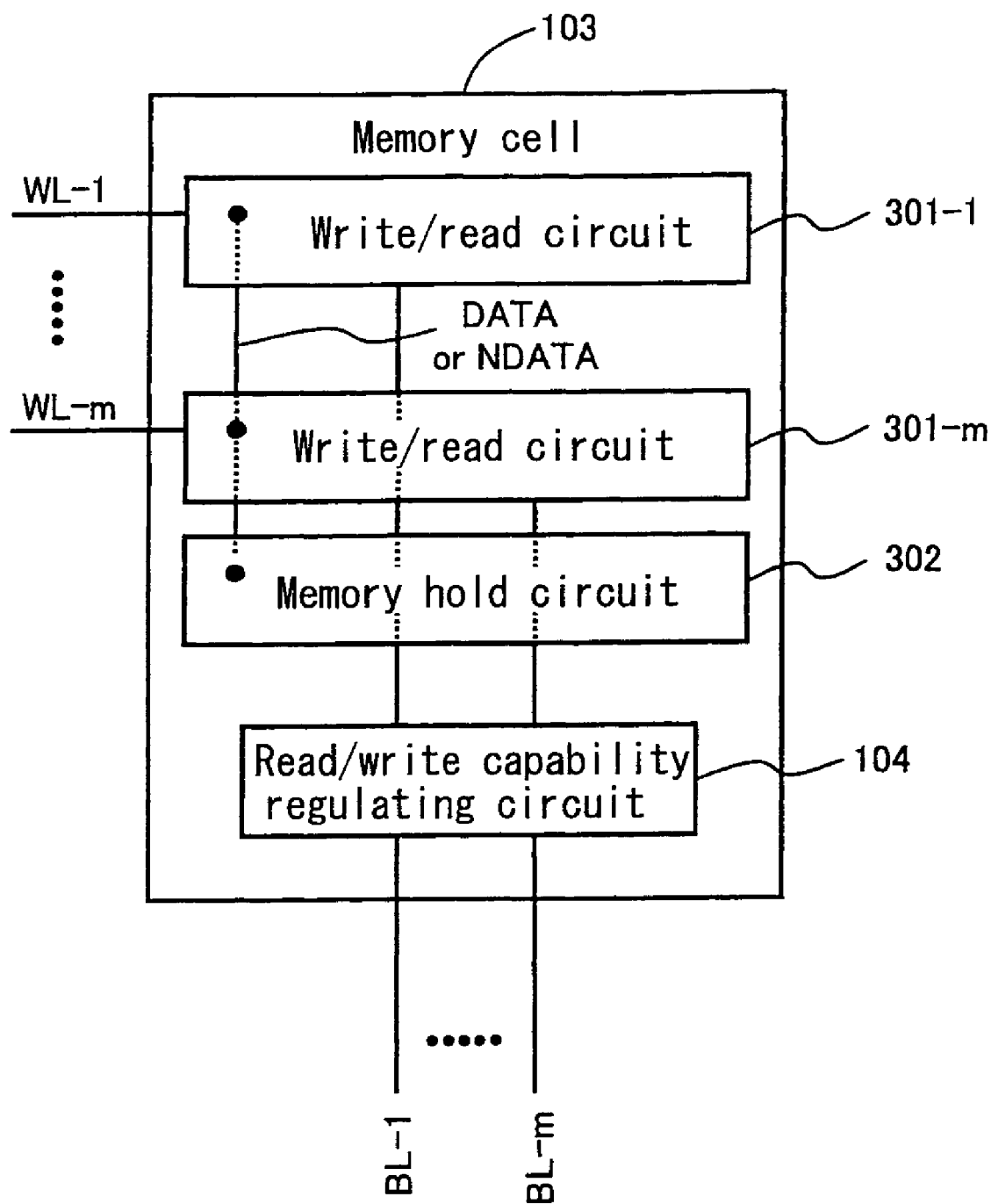
FIG. 3 is a block diagram showing a configuration of the inside of a memory cell (with a write/read circuit) in the multiport memory of the concrete example of the basic of the present invention.

FIG. 1 is a block diagram showing a configuration of a multiport memory in Concrete Example 1 as a concrete example of the basic of the present invention. FIGS. 2 and 3 are block diagrams each showing a configuration of the inside of a memory cell in the multiport memory.

In FIG. 1, reference numeral 101 denotes a CPU (central processing unit). Reference numeral 102 denotes a row decoder. Reference numeral 103 denotes a memory cell, and the memory cells 103 are arranged in array form in row and column directions. Reference numeral 104 denotes a read/write capability regulating circuit.

In FIG. 2, reference numeral 201-1 to reference character 201-$m$ denote m units (m is an integer not less than 1) of write circuits. Reference numeral 202 denotes a memory hold circuit. Reference numeral 203-1 to reference character 203-$n$ denote n units (n is an integer not less than 1) of read circuits. Each of the memory cells 103 is provided with the read/write capability regulating circuit 104. Each of the read/write capability regulating circuit 104 is connected to the CPU 101. The read/write capability regulating circuit 104 individually sets a write capability in each of a plurality of write circuits 201-$i$ (i=1, 2 . . . m) and a read capability in each of a plurality of read circuits 203-$j$ (j=1, 2 . . . n) in each of the memory cells 103. The read/write capability regulating circuit 104 is connected to the write circuits 201-$i$ and the read circuits 203-$j$ using bit lines arranged along one column direction, namely the longitudinal direction in FIG. 1. One common read/write capability regulating circuit 104 may be arranged with respect to the memory cells.

FIG. 3 shows a configuration of a memory cell of a type having circuits each serving as both a write and read circuits. In FIG. 3, reference numeral 301-1 to reference character 301-$m$ denote m units (m is an integer not less than 1) of write/read circuits. Reference numeral 302 denotes a memory hold circuit. Each of the memory cells 103 is provided with the read/write capability regulating circuit 104. The read/write capability regulating circuit 104 individually sets a write capability and a read capability in each of a plurality of write/read circuits 301-$i$ ($i$=1, 2 . . . n) in each of the memory cells 103. The read/write capability regulating circuit 104 is connected using bit lines arranged along one column direction, namely the longitudinal direction in FIG. 1. One common read/write capability regulating circuit 104 may be arranged with respect to the memory cells.

It is to be noted that the write circuit and the read circuit in FIG. 2 may be mixed with the write/read circuit in FIG. 3 to configure a memory cell.

In the following, the operation of the multiport memory cell of the present concrete example is described. In the description, a write operation includes a write operation of the write/read circuit, and a read operation includes a read operation of the write/read circuit.

Write address signals WA-1 to WA-m, write enable signals WE-1 to WE-m, read address signals RA-1 to RA-n, and read enable signals RE-1 to RE-n are given from the CPU 101 to the row decoder 102.

The row decoder 102 decodes the write address signals WA-1 to WA-m. Further, based upon the decoding results, the row decoder 102 selects any one of write enable lines (word lines) WWL1-1 to WWLa-m (a is an integer not less than 1). The row decoder 102 also decodes the read address signals RA-1 to RA-n. Further, based upon the decoding results, the row decoder 102 selects any one of read enable lines (word lines) RWL1-1 to RWLb-n (b is an integer not less than 1). It should be noted that the write address signals WA-1 to WA-m and the read address signals RA-1 to RA-n each have a bit width not less than 1.

Each of the memory cells 103 comprises the read/write capability regulating circuit 104. Each of the read/write capability regulating circuits 104 comprises a write capability regulating portion and a read capability regulating portion which are not shown in the figure. The write capability regulating portion individually sets a write capability in each of a plurality of write circuits 201-$i$ ($i$=1, 2 . . . m). The read capability regulating portion individually sets a read capability in each of a plurality of read circuits 203-$j$ ($j$=1, 2 . . . n).

Write bit lines WBL1-1 to WBLc-m (c is an integer not less than 1), and read bit lines RBL1-1 to RBLd-n (d is an integer not less than 1) connect the memory cells 103 groups which are column-arranged along an extending direction of each of the bit lines.

It should be noted that there are some cases where an inverted enable line is added to the enable lines depending upon the constitution of the memory cell. Further, when the memory cell has the configuration of FIG. 3, common write/read enable lines may be used.

It should be noted that there are some cases where an inverted enable line is added to the bit lines depending upon the constitution of the memory cell. Further, when the memory cell has the configuration of FIG. 3, common write/read bit lines may be used.

Figure 4:
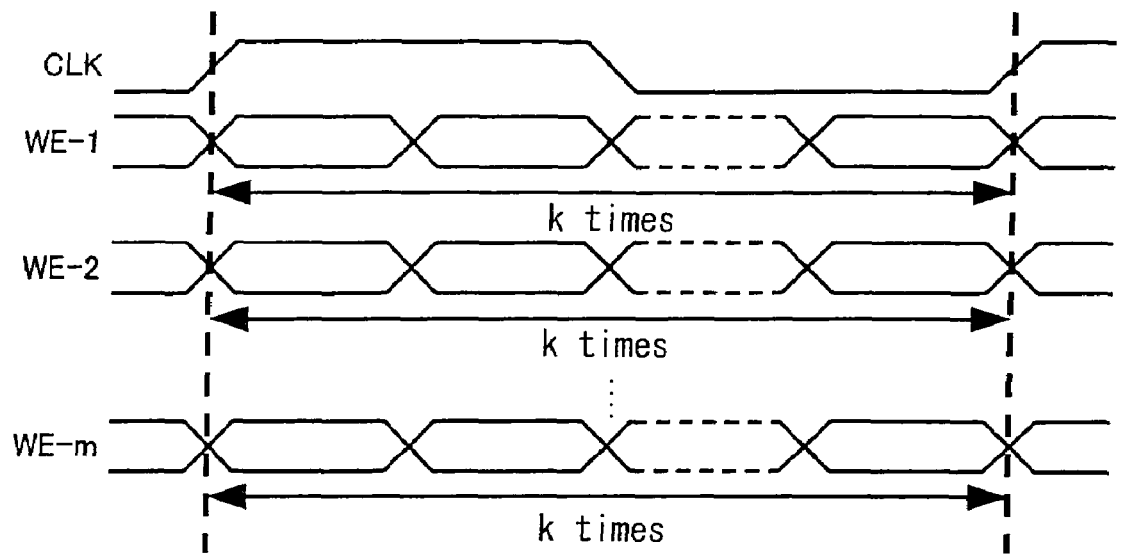
FIG. 4 is a timing chart showing a write operation in a comparative example corresponding to a conventional circuit.

As shown in FIG. 4, the write enable signals WE-1 to WE-m operate k times (k is an integer not less than 1) during one cycle, to select the write word lines WWL1-1 to WWWc-m based upon addresses given with the write address signals WA-1 to WA-m, for the writing into the memory cell 103.

Here, if all the write circuits need to perform writing up to k times per cycle, the write enables need to operate k times among all the write circuits, as shown in FIG. 4.

Figure 5:
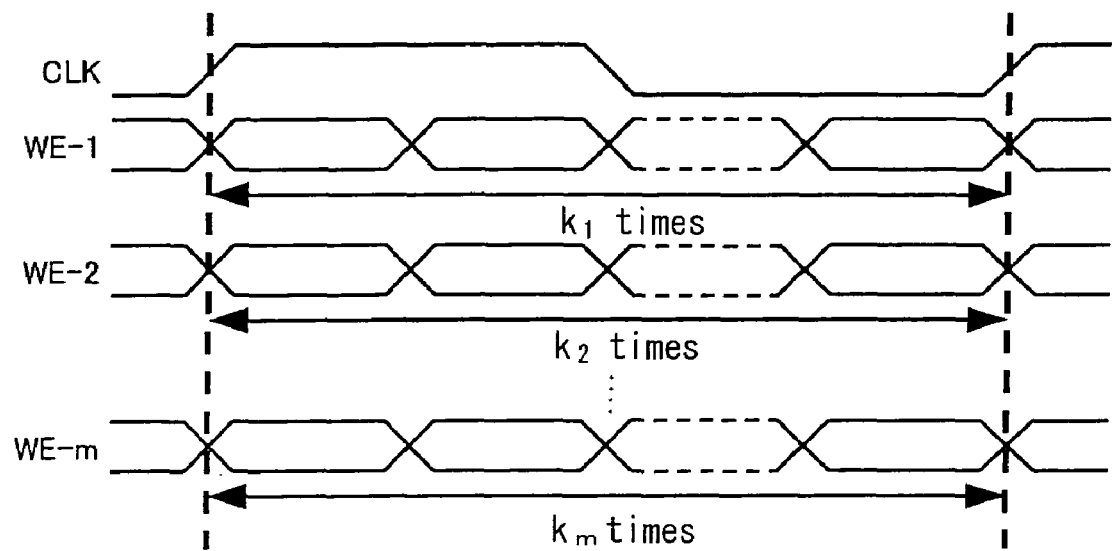
FIG. 5 is a timing chart showing a write operation in the concrete example of the basic of the present invention.

However, when the respective write circuits 201-1 to 201-$m$ are required to have different write capabilities, the write capability regulating portion in the read/write capability regulating circuit 104 performs writing $k_1$ to $k_m$ times ($k_1$ to $k_m$ are integers not less than 0, and $0<k_1<k_m\leq k$) during one cycle with respect to each of the write circuits, as shown in FIG. 5. In this manner, a write capability of each of the write circuits 201-1 to 201-$m$ is individually set.

It should be noted that, the write capability of each of the write circuits 201-1 to 201-$m$ is also settable by changing the number of bit lines in each of the circuits. Namely, in FIG. 1, the number of provided write bit lines (WBL) is "c" in each of the write circuits 201-1 to 201-$m$. Then, by changing the set number of write bit lines (WBL) in each of the write circuits in the range of $c_1$ to $c_m$ ($c_1$ to $c_m$ are integers not less than 0, and $0<c_1<c_m\leq c$), the write capability of each of the write circuits 201-1 to 201-$m$ is individually set.

Figure 6:
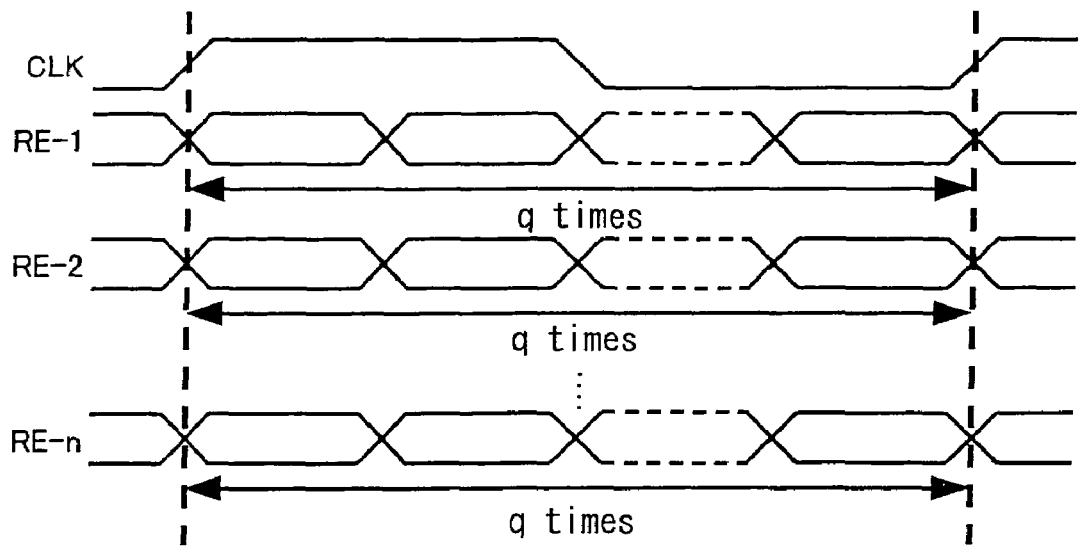
FIG. 6 is a timing chart showing a read operation in an comparative example corresponding to a conventional circuit.

Further, as shown in FIG. 6, the read enable signals RE-1 to RE-n instruct an operation q times (q is an integer not less than 1) during one cycle so as to select specific read word lines RWL1-1 to RWLc-n based upon addresses designated with the read address signals RA-1 to RA-n. Subsequently, data are read q times during one cycle from the memory cell 103 through the selected read word lines RWL1-1 to RWLc-n.

Here, if all the read circuits need to perform reading up to q times per cycle, the read enables need to operate q times among all the read circuits, as shown in FIG. 6.

Figure 7:
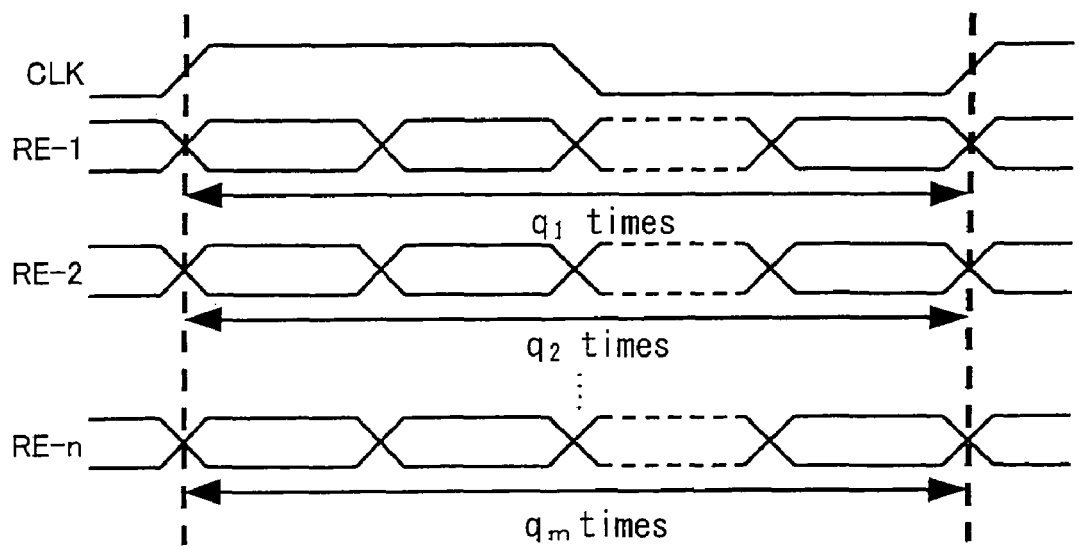
FIG. 7 is a timing chart showing a read operation in the concrete example of the basic of the present invention.

However, when the respective read circuits 203-1 to 203-$n$ are required to have different read capabilities, the read capability regulating portion in the read/read capability regulating circuit 104 performs reading $q_1$ to $q_n$ times ($q_1$ to $q_n$ are integers not less than 0, and $0<q_1<q_n\leq q$) during one cycle with respect to each of the read circuits, as shown in FIG. 7. In this manner, a read capability of each of the read circuits 203-1 to 203-$n$ is individually set.

It should be noted that, the read capability of each of the read circuits 203-1 to 203-$n$ is also settable by changing the number of bit lines in each of the circuits. Namely, in FIG. 1, the number of provided read bit lines (RBL) is "d" in each of the read circuits 203-1 to 203-$n$. Then, also by changing the set number of read bit lines (RBL) in each of the read circuits in the range of $d_1$ to $d_n$ ($d_1$ to $d_n$ are integers not less than 0, and $0<d_1<d_n\leq d$), the read capability of each of the read circuits 203-1 to 203-$n$ can be individually set.

Next, a configuration and a method for individually setting the number of access times in each of the write circuits, the read circuits, and the write/read circuits are specifically described.

CONCRETE EXAMPLE 2

In the configuration of FIG. 1, a plurality of write circuits 201-$i$ and a plurality of read circuits 203-$j$ are provided in each of the memory cells 103. However, some memory cells 103 are configured to comprise at least either a single write circuit or a single read circuit.

Between wirings of these circuits, interference such as crosstalk may occur due to the close state of the wirings, to generate a noise. As one example, in a configuration where an arbitrary first bit line BL-1 and a second arbitrary bit line BL-2 are adjacent to one another, when the bit line BL-1 operates, a noise due to interference may be superimposed on the adjacent bit line BL-2. Such a noise causes the circuit to become non-operative. Therefore, when the noise amount of the device as a whole has been determined as large, it is preferable that an operation concerned with the first bit line be not performed when the second bit line adjacent to the first bit line operates.

Figure 8:
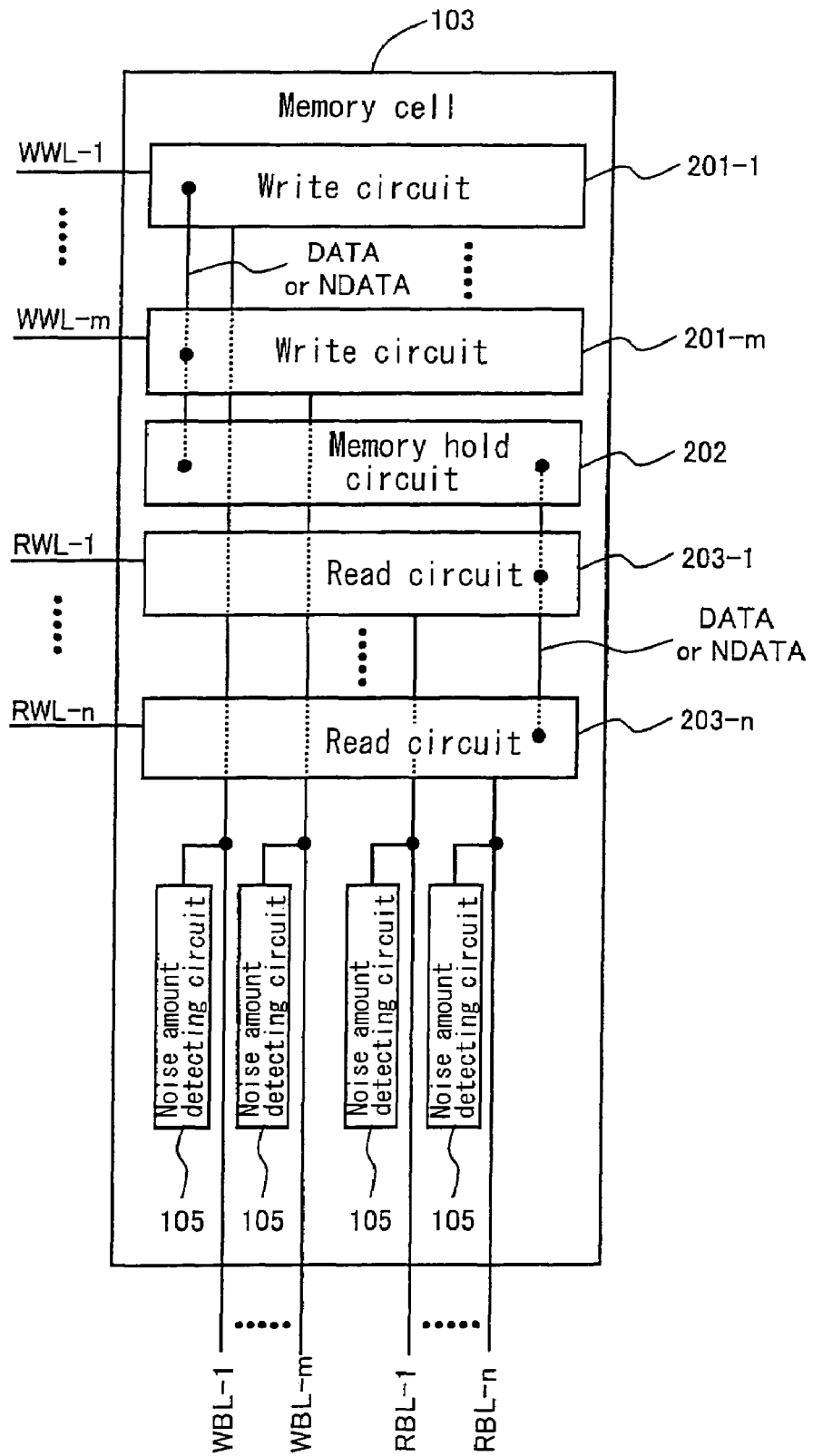
FIG. 8 is a block diagram showing a configuration of a memory cell in a multiport memory of Concrete Example 1 of the present invention.

In Concrete Example 2 of the present invention, as a countermeasure for the case where the noise amount of the device as a whole is determined as large, a noise amount detecting circuit 105 for detecting a noise amount is provided on each of the bit-lines, as shown in FIGS. 8 and 9. It is to be noted that the configuration of FIG. 8 corresponds to the configuration of the circuit of FIG. 2. The configuration of FIG. 9 corresponds to the configuration of the circuit of FIG. 3.

The read/write capability regulating circuit 104 described above with reference to FIG. 2 is provided with an operating state determining circuit for determining the number of writing times or the number of reading times per unit time with accordance with an operating state of each of the circuits. Meanwhile, in the configurations of the present concrete example shown in FIGS. 8 and 9, the noise amount detecting circuit 105 serves as the operating state determining circuit of the read/write capability regulator. It is thereby possible to discontinue an operation of a bit line upon interference therewith. This is described below.

Figure 10:
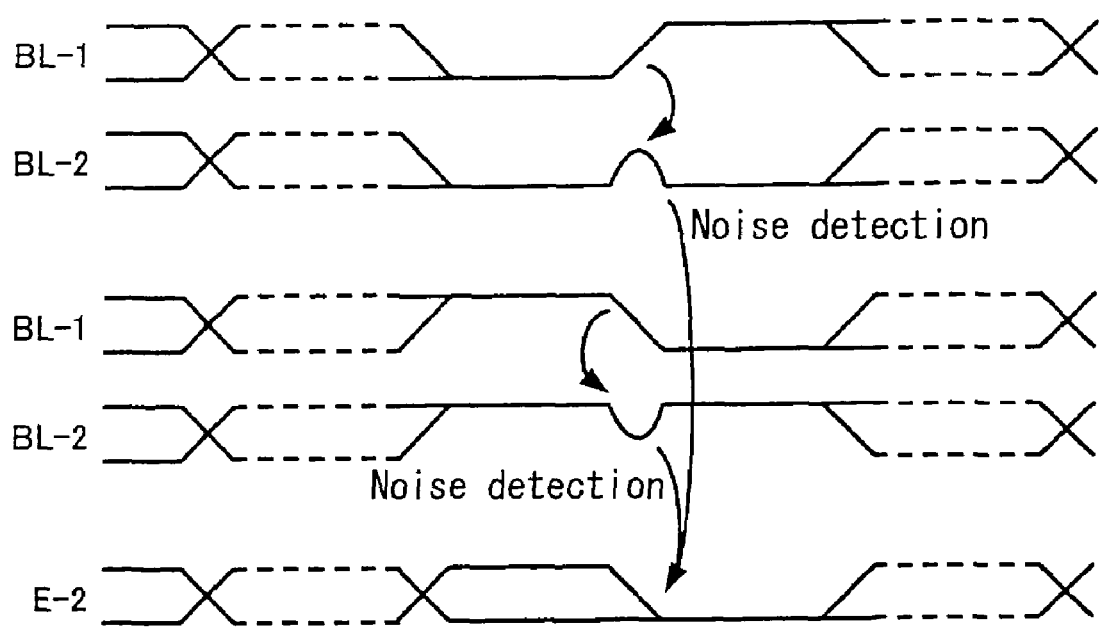
FIG. 10 is a timing chart showing the operation of the multiport memory in Concrete Example 1 of the present invention.

FIG. 10 shows a timing chart in the case of proving the noise amount detecting circuit 105 on each bit line. In Concrete Example 1, when the first bit line is made active, a noise amount superimposed on the second bit line is detected, and when the detected noise amount exceeds a prescribed threshold, an enable line E2 for the writing or reading concerned with the second bit line are made not to operate. With this configuration, the number of writing or the number of reading during one cycle is restricted in accordance with the noise amount.

Meanwhile, in the configurations of the present concrete example as shown in FIGS. 8 and 9, the noise amount detecting circuit 105 functions as the operating state determining circuit. Thereby, in the present concrete example, the read/write capability regulating circuit is configured to comprise the noise amount detecting circuit 105. Therefore, a noise amount is determined for each one of the write circuits (write/read circuits) or the read circuits (write/read circuits), and a necessary write capability or read capability is individually set in accordance with the detected result. This allows elimination of the need for an extra write operation or read operation, so as to suppress an increase in circuit scale.

CONCRETE EXAMPLE 3

Figure 11:
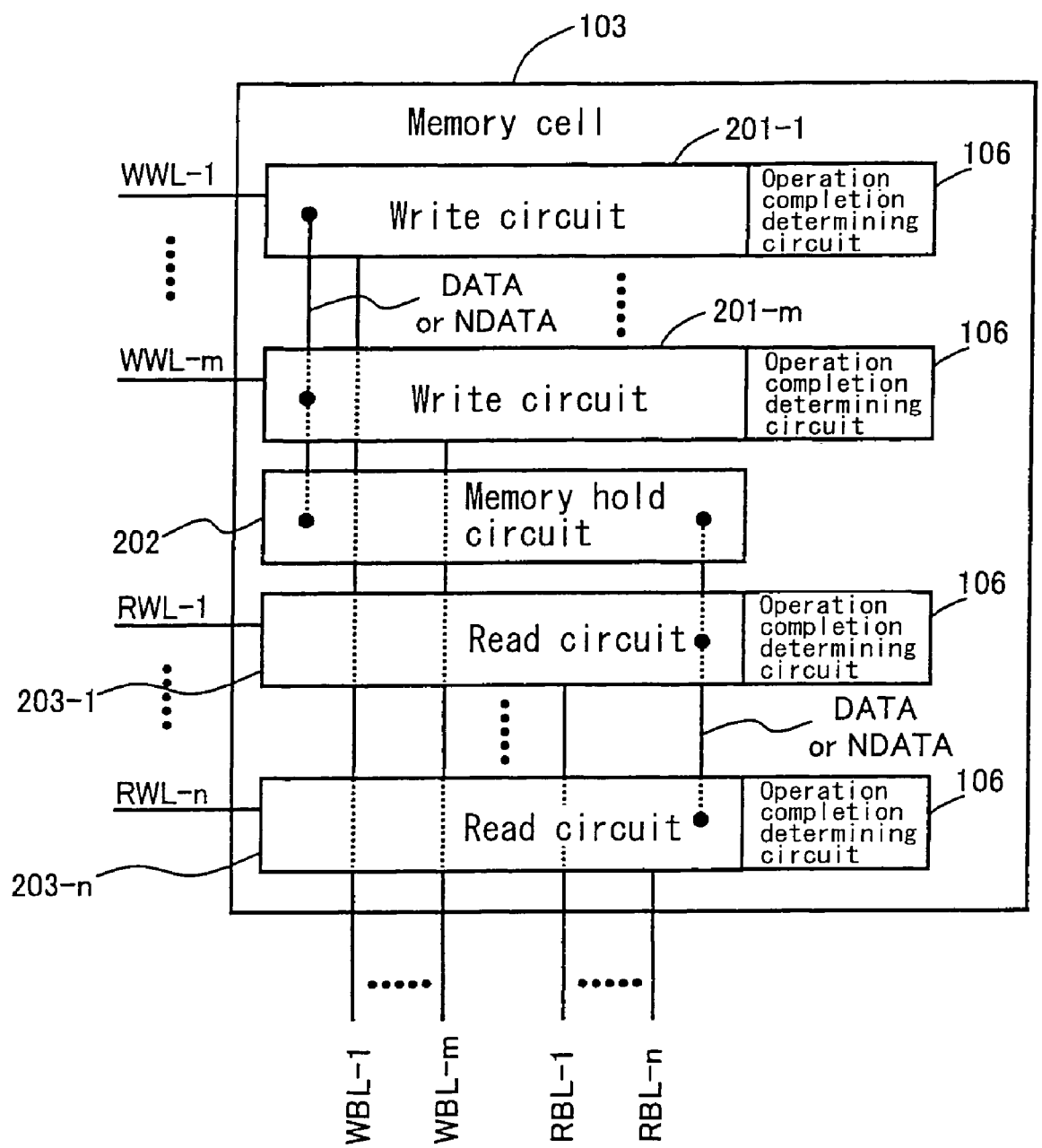
FIG. 11 is a block diagram showing a configuration of a memory cell in a multiport memory of Concrete Example 2 of the present invention.
Figure 12:
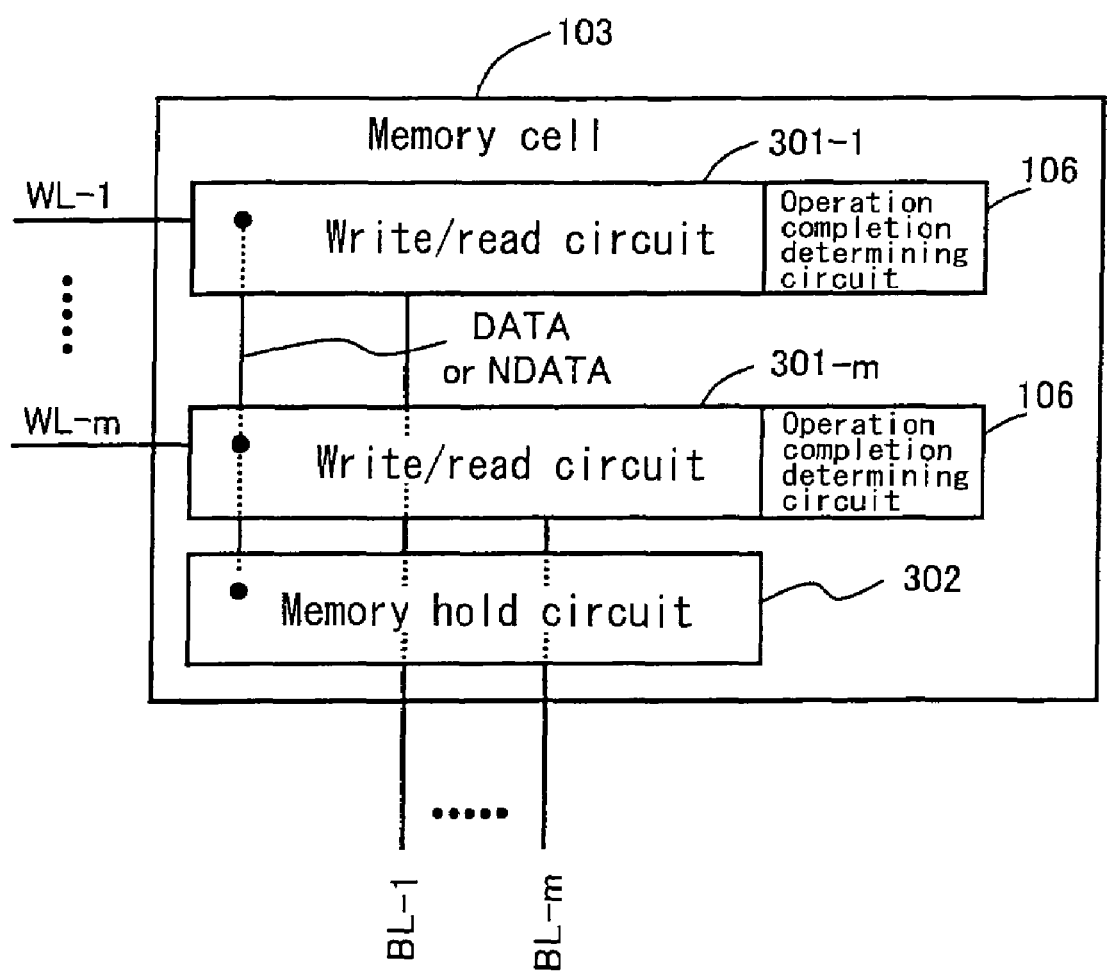
FIG. 12 is a block diagram showing a configuration of a memory cell (with write/read circuit) in a multiport memory of Concrete Example 2 of the present invention.

In the configuration of FIG. 1, each of the write circuits and the read circuits may operate at a different rate. In Concrete Example 3 of the present invention, each of the circuits is provided with an operation completion determining circuit 106, as shown in FIGS. 11 and 12. It is to be noted that the configuration of FIG. 11 corresponds to the configuration of the circuit of FIG. 2. The configuration of FIG. 12 corresponds to the configuration of the circuit of FIG. 3.

In the present concrete example, the operation completion determining circuit 106 detects completion of a write operation or a read operation. Upon detection of the completion, the next access (write operation, read operation) is performed. The operation completion determining circuit 106 that operates in the above-mentioned manner serves as the operating state determining circuit for determining the number of writing times or the number of reading times per unit time in accordance with an operating state of each of the circuits.

Figure 13:
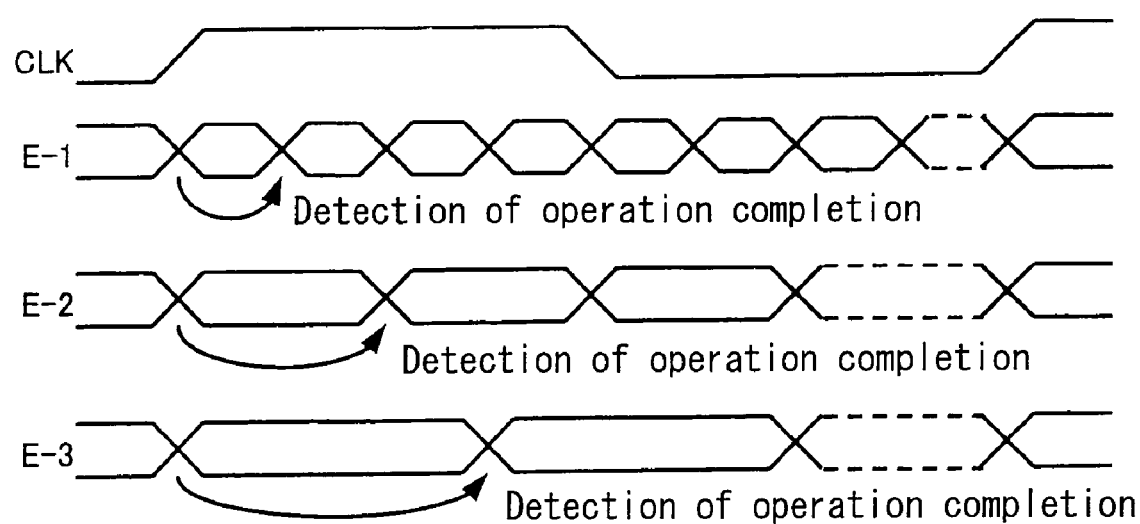
FIG. 13 is a timing chart showing the operation of the multi memory in Concrete Example 2 of the present invention.

FIG. 13 shows a timing chart in the case of providing the operation completion determining circuit 106. In Concrete Example 2, the number of writing times or the number of reading times were regulated in each of the circuits in accordance with an operating time.

In the configurations of the present concrete example as shown in FIGS. 11 and 12, the operation completion determining circuit 106 detects completion of an operation of each of the write circuits (write/read circuits) or the read circuits (write/read circuits). Based upon the detected result, an operating rate of each of the circuits is determined, and in accordance with the determination result, a necessary write capability or read capability of each of the write circuits (write/read circuits) or the read circuits (write/read circuits) is individually set. This allows elimination of the need for an extra write operation or read operation, and suppression of an increase in circuit size.

CONCRETE EXAMPLE 4

Figure 14:
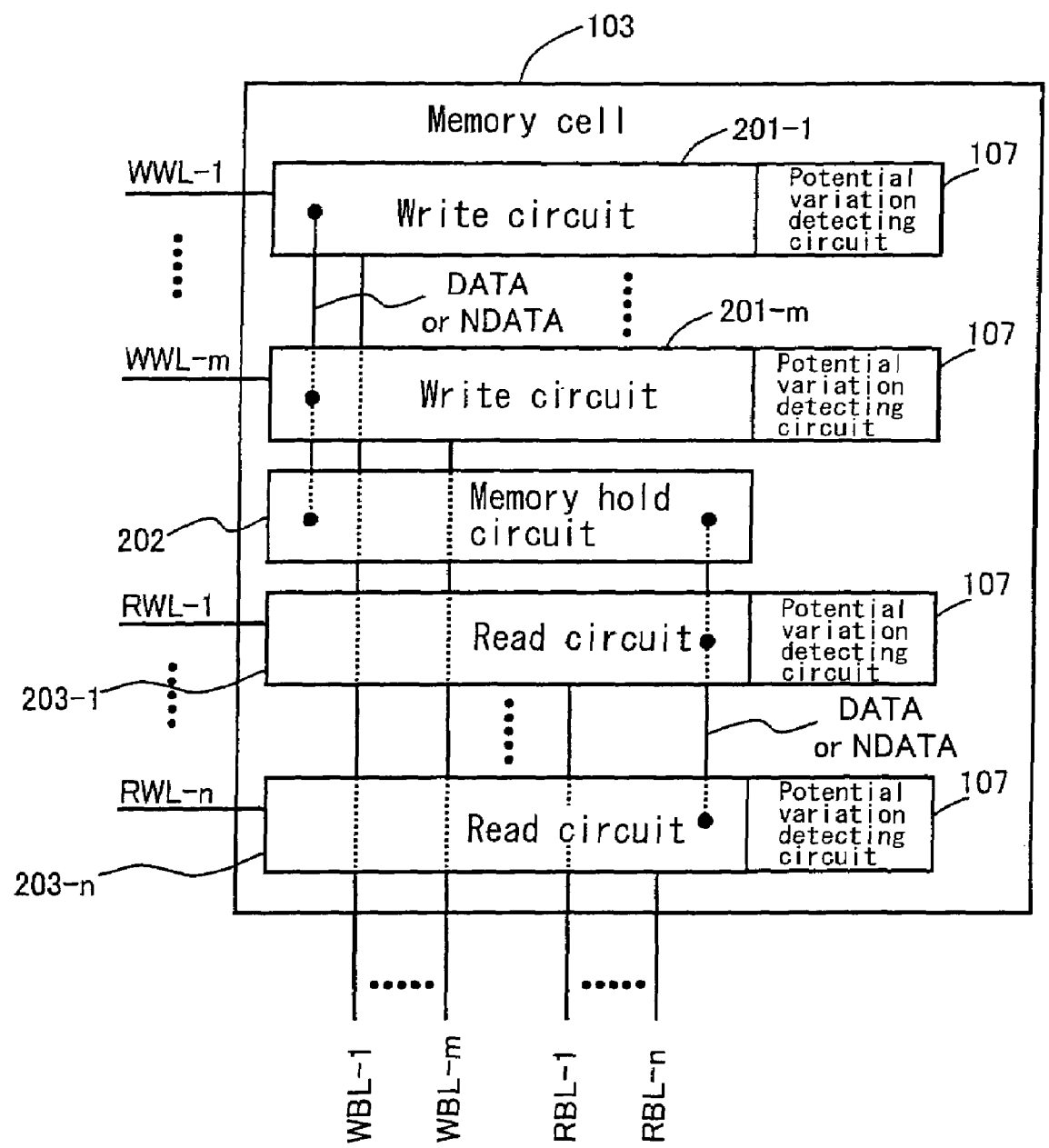
FIG. 14 is a block diagram showing a configuration of a memory cell in a multiport memory of Concrete Example 3 of the present invention.

In the configuration of FIG. 1, a potential of a power source/signal lines may fluctuate when the write circuit operates and when the read circuit operates. The occurrence of such a potential fluctuation may cause lowering of the operating rate. In Concrete Example 4 of the present invention, each of the circuits is provided with a potential fluctuation detecting circuit 107, as shown in FIGS. 14 and 15. It is to be noted that the configuration of FIG. 14 corresponds to the configuration of the circuit of FIG. 2. The configuration of FIG. 15 corresponds to the configuration of the circuit of FIG. 3.

In the configurations of the present concrete example as shown in FIGS. 14 and 15, the potential fluctuation detecting circuit 107 detects a potential fluctuation in power source/signal lines, concerned with each of the circuits, from a reference potential. Thereafter, the potential fluctuation detecting circuit 107 functions as the operating state determining circuit for determining the number of writing times or the number of reading times per unit time in accordance with an operating state of each of the circuits. In the present concrete example, the read/write capability regulating circuit is configured to comprise the potential fluctuation detecting circuit 107.

Figure 16:
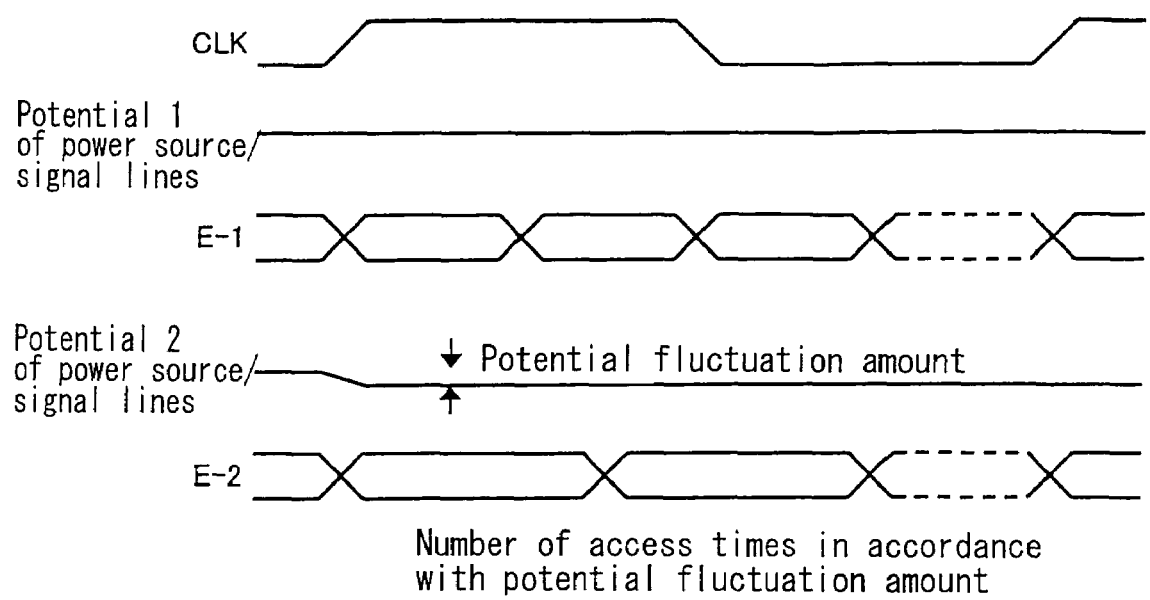
FIG. 16 is a timing chart showing the operation of the multi memory in Concrete Example 3 of the present invention.

FIG. 16 is a timing chart showing the case of providing the potential variation detecting circuit 107. The upper timing chart in the figure shows a state where a write operation or a read operation is performed at a high access rate because of the absence of a potential fluctuation. However, the lower timing chart in the figure shows a state where, because of the presence of a potential fluctuation, the potential fluctuation detecting circuit 107 detects the presence of the potential fluctuation, to lower an access rate.

As thus described, in the present concrete example, the potential fluctuation detecting circuit 107 is provided for detecting a potential fluctuation in power source/signal lines which are concerned with each of the circuits, and in accordance with the detected result, the number of writing times or the number of reading times of each of the circuits during one cycle is regulated. It is thereby possible to obtain an operating rate in accordance with the potential fluctuation in power source/signal lines.

According to the present concrete example, the read/write capability regulating circuit 104 including the potential variation detecting circuit 107 detects a potential fluctuation in power source/signal lines, and in accordance with the detected result, the required number of writing times or reading times is individually set for each one of the write circuits (write/read circuits) or the read circuits (write/read circuits). This allows elimination of the need for an extra write operation or read operation, so as to suppress an increase in circuit scale.

CONCRETE EXAMPLE 5

There are some cases where a capability for a write operation or a capability for a read operation is previously specified in a specification, and in these cases, the number of access times of each of the write circuits or the read circuit during one cycle is constantly regulated based upon the previously specified specification. Hence in the present concrete example, the number of writing times or the number of reading times of each of the cycles during one cycle is settable from the outside regardless of the operating state of the inside of the circuit. It is thereby possible to obtain a capability for a write operation or a capability for a read operation in an optimum state for the specification.

(Further Improvement in the Present Invention)

In the basic configuration of the present invention as shown in Concrete Example 1 of FIG. 1, when the enable line of each of the write circuits or the read circuits is in an active state, it is necessary to secure the operation by keeping a power source potential of each circuit at a rating value or by raising the potential to a value higher than the rating value. On the other hand, when the enable line is in an inactive state, there occurs no problem even when the power source potential of each of the circuits is lowered.

Focusing attention on this, in each of the concrete examples of the present invention, in a state where the enable line of each of the write circuits or the read circuits is inactive, it is possible to seek reduction in power consumption of each of the circuits by lowering a power source potential of a circuit portion, having no effect on the memory holding, in each of the circuits. Further, in the case where the enable line of each of the write circuits or the read circuits is active, it is possible to seek acceleration as well as stabilization of an operation of each of the circuits by increasing a power source potential of a circuit portion, having no effect on the memory holding, in each of the circuits.

The multiport memory of the present invention is effectively used as a technique for seeking reduction in circuit size as well as power consumption in a semiconductor device and the like having, on a semiconductor substrate, a memory hold circuit, a plurality of write circuits and read circuits or a plurality of write/read circuits.

Although the present invention is specifically described with respect to the most preferable concrete examples, it should be appreciated that various modifications can be made in the combination and arrangement of components in the favorable embodiment without departing from the sprit and scope of the invention as later claimed.

What is claimed is:

1. A multiport memory, comprising:
   a plurality of write circuits;
   a memory hold circuit for holding data written by the plurality of write circuits; and
   a write capability regulator for individually setting a capability to write data into the memory hold circuit by each of the plurality of write circuits and for individually setting the number of writing times per unit time of each of the plurality of write circuits.

2. The multiport memory as claimed in claim 1, wherein the write circuit is a write/read circuit.

3. The multiport memory as claimed in claim 1, wherein the write capability regulator has an operating state determining circuit, and
   the operating state determining circuit determines the number of writing times per the unit time of each of the write circuits in accordance with an operating state of each of the write circuits.

4. The multiport memory as claimed in claim 3, wherein the operating state determining circuit has a noise amount detecting circuit, and
   the noise amount detecting circuit determines the number of writing times per the unit time of each of the write circuits based upon detection of a noise amount of each of the write circuits, the noise being due to interference between wirings of the write circuits.

5. The multiport memory as claimed in claim 3, wherein the operating state determining circuit has an operating rate detecting circuit, and
   the operating rate detecting circuit determines the number of writing times per the unit time of each of the write circuits based upon detection of an operating rate of each of the write circuits.

6. The multiport memory as claimed in claim 3, wherein the operating state determining circuit has a potential fluctuation detecting circuit, and
   the potential fluctuation detecting circuit determines the number of writing times per the unit time of each of the write circuits based upon detection of a potential of a power source/signal lines in a circuit region of each of the write circuits.

7. The multiport memory as claimed in claim 1, wherein the write capability regulator is configured such that the number of writing times per the unit time of each of the write circuits is settable from the outside in accordance with a circuit specification of each of the write circuits.

8. The multiport memory as claimed in claim 1, wherein the write capability regulator regulates a source potential of each of the write circuits in accordance with an active/inactive state of an operation of each of the write circuits.

9. The multiport memory as claimed in claim 8, wherein the write capability regulator lowers a source potential of each of the write circuits when an operation of each of the write circuits is inactive.

10. The multiport memory as claimed in claim 8, wherein the write capability regulator raises a source potential of each of the write circuits to accelerate an operation rate thereof when an operation of each of the write circuits is active.

11. A multiport memory, comprising:
    a plurality of read circuits;
    a memory hold circuit from which data is read by means of the read circuits; and
    a read capability regulator for individually setting a capability to read data from the memory hold circuit by each of the plurality of read circuits and for individually setting the number of reading times per unit time of each of the plurality of read circuits.

12. The multiport memory as claimed in claim 11, wherein the read circuit is a write/read circuit.

13. The multiport memory as claimed in claim 11, wherein
    the read capability regulator has an operating state determining circuit, and the operating state determining circuit determines the number of reading times per the unit time of each of the read circuits in accordance with an operating state of each of the read circuits.

14. The multiport memory as claimed in claim 13, wherein
the operating state determining circuit has a noise amount detecting circuit, and
the noise amount detecting circuit determines the number of reading times per the unit time of each of the read circuits based upon detection of a noise amount of each of the read circuits, the noise being due to interference between wirings of the read circuits.

15. The multiport memory as claimed in claim 13, wherein
the operating state determining circuit has an operating rate detecting circuit, and
the operating rate detecting circuit determines the number of reading times per the unit time of each of the read circuits based upon detection of an operating rate of each of the read circuits.

16. The multiport memory as claimed in claim 13, wherein
the operating state determining circuit has a potential fluctuation detecting circuit, and
the potential fluctuation detecting circuit determines the number of reading times per the unit time of each of the read circuits based upon detection of a potential of a power source/signal lines in a circuit region of each of the read circuits.

17. The multiport memory as claimed in claim 11, wherein the read capability regulator is configured such that the number of reading times per the unit time of each of the read circuits is settable from the outside in accordance with a circuit specification of each of the read circuits.

18. The multiport memory as claimed in claim 11, wherein the read capability regulator regulates a source potential of each of the read circuits in accordance with an active/inactive state of an operation of each of the read circuits.

19. The multiport memory as claimed in claim 18, wherein the read capability regulator lowers a source potential of each of the read circuits when an operation of each of the read circuits is inactive.

20. The multiport memory as claimed in claim 18, wherein the read capability regulator raises a source potential of each of the read circuits to accelerate an operation rate thereof when an operation of each of the read circuits is active.

21. A multiport memory, comprising:
a plurality of write circuits;
a memory hold circuit for holding data written by the plurality of write circuits; and
a write capability regulator for individually setting a capability to write data into the memory hold circuit by each of the plurality of write circuits,
wherein the write capability regulator regulates a source potential of each of the write circuits in accordance with an active/inactive state of an operation of each of the write circuits, and
the write capability regulator lowers a source potential of each of the write circuits when an operation of each of the write circuits is inactive.

22. A multiport memory, comprising:
a plurality of write circuits;
a memory hold circuit for holding data written by the plurality of write circuits; and
a write capability regulator for individually setting a capability to write data into the memory hold circuit by each of the plurality of write circuits,
wherein the write capability regulator regulates a source potential of each of the write circuits in accordance with an active/inactive state of an operation of each of the write circuits, and
the write capability regulator raises a source potential of each of the write circuits to accelerate an operation rate thereof when an operation of each of the write circuits is active.

23. A multiport memory, comprising:
a plurality of read circuits;
a memory hold circuit from which data is read by means of the read circuits; and
a read capability regulator for individually setting a capability to read data from the memory hold circuit by each of the plurality of read circuits,
wherein the read capability regulator regulates a source potential of each of the read circuits in accordance with an active/inactive state of an operation of each of the read circuits, and
the read capability regulator lowers a source potential of each of the read circuits when an operation of each of the read circuits is inactive.

24. A multiport memory, comprising:
a plurality of read circuits;
a memory hold circuit from which data is read by means of the read circuits; and
a read capability regulator for individually setting a capability to read data from the memory hold circuit by each of the plurality of read circuits,
wherein the read capability regulator regulates a source potential of each of the read circuits in accordance with an active/inactive state of an operation of each of the read circuits, and
the read capability regulator raises a source potential of each of the read circuits to accelerate an operation rate thereof when an operation of each of the read circuits is active.

* * * * *